(12) United States Patent
Barton

(10) Patent No.: US 6,552,573 B1
(45) Date of Patent: Apr. 22, 2003

(54) SYSTEM AND METHOD FOR REDUCING LEAKAGE CURRENT IN DYNAMIC CIRCUITS WITH LOW THRESHOLD VOLTAGE TRANSISTORS

(75) Inventor: James B. Barton, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/713,585

(22) Filed: Nov. 15, 2000

Related U.S. Application Data
(60) Provisional application No. 60/175,349, filed on Jan. 10, 2000.

(51) Int. Cl.[7] .......................................... H03K 19/096
(52) U.S. Cl. ........................... 326/95; 326/93; 326/98; 326/112; 326/119; 326/121
(58) Field of Search .............................. 326/93, 95, 98, 326/112, 119, 121

(56) References Cited

U.S. PATENT DOCUMENTS

| | | | | |
|---|---|---|---|---|
| 5,712,826 A | * | 1/1998 | Wong et al. .................. | 365/226 |
| 5,815,005 A | * | 9/1998 | Bosshart ....................... | 326/95 |
| 5,821,778 A | * | 10/1998 | Bosshart ....................... | 326/95 |
| 5,831,451 A | * | 11/1998 | Bosshart ....................... | 326/93 |
| 5,870,411 A | * | 2/1999 | Durham et al. ................ | 326/93 |
| 5,910,735 A | * | 6/1999 | Allen ........................... | 326/93 |
| 6,002,292 A | * | 12/1999 | Allen et al. ................... | 327/379 |
| 6,111,434 A | * | 8/2000 | Ciraula et al. ............... | 326/121 |
| 6,118,309 A | * | 9/2000 | Akamatsu et al. ........... | 327/108 |
| 6,246,266 B1 | * | 6/2001 | Bosshart ....................... | 326/98 |
| 6,259,275 B1 | * | 7/2001 | Beiu ............................ | 326/112 |
| 6,275,071 B1 | * | 8/2001 | Ye et al. ....................... | 326/98 |
| 2002/0057112 A1 | * | 5/2002 | Ye et al. ...................... | 326/121 |
| 2002/0089352 A1 | * | 7/2002 | Hanson et al. ................ | 326/95 |

\* cited by examiner

*Primary Examiner*—Michael Tokar
*Assistant Examiner*—Khai Nguyen
(74) *Attorney, Agent, or Firm*—Robert D. Marshall, Jr.; W. James Brady, III; Frederick J. Telecky, Jr.

(57) ABSTRACT

A reduced-leakage current dynamic circuit (10) is disclosed that includes a logic circuit (30), a pre-charge transistor (32), and a standby transistor (40). The logic circuit (30) is coupled to an internal output node (50). The logic circuit (30) includes a plurality of logic transistors (60 and 62) having a low threshold voltage. The pre-charge transistor (32) is coupled to the internal output node (50). The pre-charge transistor (32) is operable to provide a pre-charge voltage at the internal output node (50) and has a standard threshold voltage. The standby transistor (40) is coupled to the internal output node (50). The standby transistor (40) is operable to provide a standby voltage at the internal output node (50).

9 Claims, 3 Drawing Sheets

SYSTEM AND METHOD FOR REDUCING LEAKAGE CURRENT IN DYNAMIC CIRCUITS WITH LOW THRESHOLD VOLTAGE TRANSISTORS

This application claims priority under 35 USC §119(e) (1) of Provisional Application No. 60/175,349, filed Jan. 10, 2000.

TECHNICAL FIELD OF THE INVENTION

This invention relates generally to digital signal processing and more particularly to a system and method for reducing leakage current in dynamic circuits with low threshold voltage transistors.

BACKGROUND OF THE INVENTION

In the art of digital signal processing, the speed of dynamic circuits is becoming increasingly important. Thus, in order to improve the speed of these circuits, one technique has been to use low threshold voltage transistors. However, disadvantages associated with using low threshold voltage transistors include an increased leakage current for the circuit while in standby mode.

Previous attempts to solve this leakage problem have included using a combination of low threshold voltage transistors and standard threshold voltage transistors in a circuit. However, this previous solution is less than optimum as it has failed to provide as great an increase in speed as possible due to the use of standard threshold voltage transistors which are slower than the low threshold voltage transistors.

Thus, the previous solution to the leakage problem with low threshold voltage transistors counter-acts the increased speed provided by the low threshold voltage transistors, which was the original reason for their use.

SUMMARY OF THE INVENTION

In accordance with the present invention, a system and method for reducing leakage current in dynamic circuits with low threshold voltage transistors are provided that substantially eliminate or reduce disadvantages and problems associated with previously developed systems and methods. In particular, a dynamic circuit with low threshold voltage transistors is disclosed that provides reduced leakage current without a decrease in speed.

In one embodiment of the present invention, a reduced-leakage current dynamic circuit is provided that includes a logic circuit, a pre-charge transistor, and a standby transistor. The logic circuit is coupled to an internal output node. The logic circuit includes a plurality of logic transistors having a low threshold voltage. The pre-charge transistor is coupled to the internal output node. The pre-charge transistor is operable to provide a pre-charge voltage at the internal output node and has a standard threshold voltage. The standby transistor is coupled to the internal output node. The standby transistor is operable to provide a standby voltage at the internal output node.

Technical advantages of the present invention include providing an improved dynamic circuit with low threshold voltage transistors. In particular, a pre-charge transistor has a standard threshold voltage, while logic transistors have low threshold voltages. As a result, pre-charging (which is not a time-critical operation) is accomplished with a standard threshold voltage transistor, and discharging (which is a time-critical operation) is accomplished with low threshold voltage transistors. Accordingly, the standard threshold voltage transistors may be used without reducing speed.

Other technical advantages of the present invention include reducing the leakage current. In particular, an internal output node is discharged through a standby transistor during standby mode. Additionally, the dynamic circuit is placed in standby mode while the clock is high. As a result, during standby mode, the path from the internal output node to an opposite power rail is blocked by a standard threshold voltage transistor which reduces leakage current.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like numerals represent like parts, in which.

DETAILED DESCRIPTION OF THE INVENTION

Figure 1:
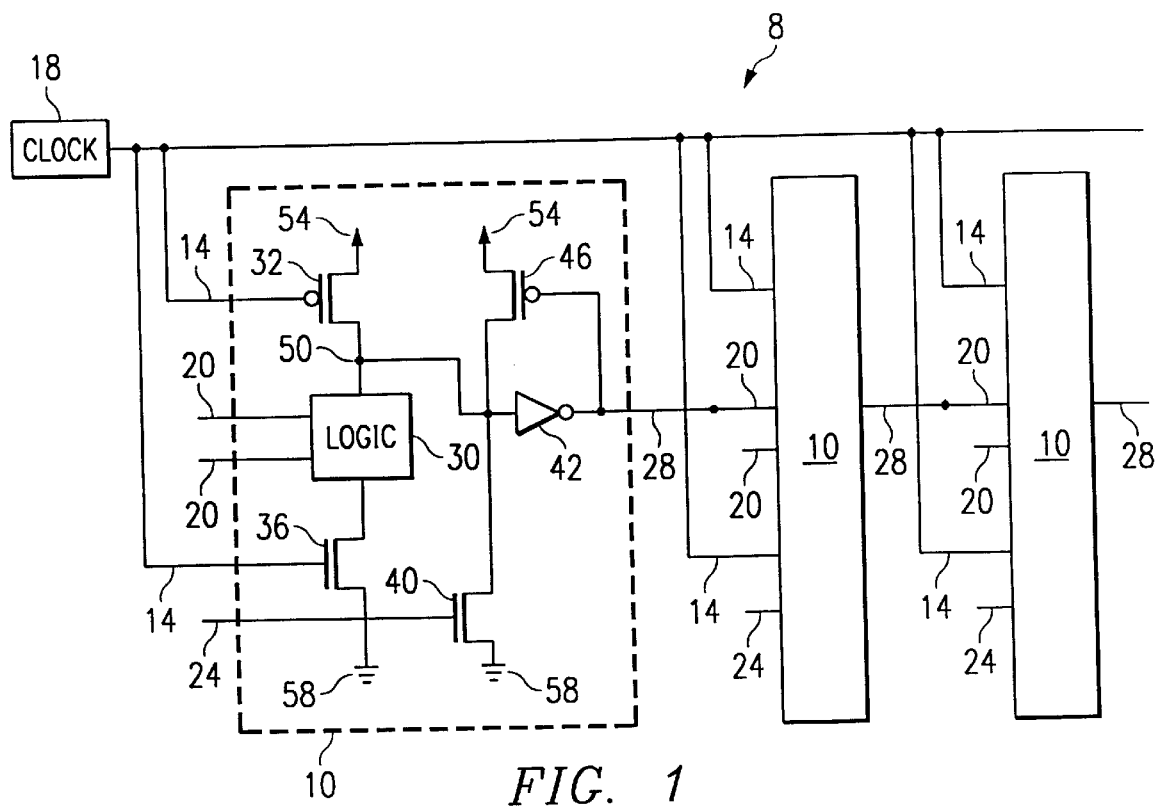
FIG. 1 is a block diagram illustrating a reduced-leakage current dynamic circuit constructed in accordance with one embodiment of the present invention.

FIG. 1 is a block diagram illustrating a reduced-leakage current dynamic circuit 8 constructed in accordance with one embodiment of the present invention. The dynamic circuit 8 may be a circuit for performing a complex logic function, such as an adder circuit, or any other suitable high speed dynamic circuit. The dynamic circuit 8 comprises a plurality of domino gates 10. Each domino gate 10 comprises clock signal input lines 14 for receiving a clock signal from a clock 18, data input lines 20 for receiving data, a standby input line 24 for receiving a standby signal, and an output line 28 for producing an output signal. Although the embodiment shown in FIG. 1 includes two data input lines 20, it will be understood that the domino gate 10 may comprise any suitable number of data input lines 20 without departing from the scope of the present invention. In accordance with the embodiment shown, each domino gate 10 produces an output signal on the output line 28 that is received on a data input line 20 for a subsequent domino gate 10.

Each domino gate 10 comprises a logic circuit 30, a pre-charge transistor 32, an evaluation transistor 36, a standby transistor 40, an inverter 42, and an optional feedback transistor 46. As will be recognized by those skilled in the art, the evaluation transistor 36 may be optional, depending on the timing of the data signals on the data input lines 20. The logic circuit 30, the pre-charge transistor 32, the standby transistor 40, the inverter 42, and the feedback transistor 46 are all coupled to an internal output node 50. Based on the inputs received at the data input lines 20, the logic circuit 30 produces an internal output signal at the internal output node 50 which is inverted by the inverter 42 before being provided as an output signal on the output signal line 28.

The pre-charge transistor 32 and the feedback transistor 46 are coupled to a power supply 54, and the evaluation transistor 36 and the standby transistor 40 are both coupled to ground 58. It will be understood that the ground 58 provides a voltage that is lower than the voltage provided by the power supply 54. Thus, the ground 58 may comprise a power supply or other suitable voltage reference without departing from the scope of the present invention.

In operation, the domino gate 10 may be in an active mode or a standby mode. In the active mode, the clock 18 provides an alternating clock signal on the clock signal input lines 14. In the standby mode, the clock 18 provides a steady signal on the clock signal input lines 14. In accordance with an exemplary embodiment, the clock 18 provides a steady high signal on the clock signal input lines 14 while in the standby mode. Also, while in the standby mode, a standby signal is received by the standby transistor 40 on the standby input line 24. According to the exemplary embodiment, the standby signal received on the standby input line 24 is high. Thus, while in the active mode, the signal provided on the standby input line 24 is low.

While in the standby mode, the pre-charge transistor 32 is off and the standby transistor 40 is on. Thus, a path is provided from the internal output node 50 to ground 58, while the path from the internal output node 50 to the power supply 54 is removed. Thus, the internal output node 50 is discharged to ground 58, or a low value, in the standby mode. The inverter 42 inverts the low value from the internal output node 50 to generate a high output on the output line 28. This high value from the inverter 42 turns the feedback transistor 46 off, thereby removing the path from the internal output node 50 to the power supply 54 through the feedback transistor 46.

While in the active mode, when the clock signal from the clock 18 on the clock signal input line 14 is low, the pre-charge transistor 32 is on and the evaluation transistor 36 is off. Thus, the internal output node 50 is pre-charged to a high value by the power supply 54 through the pre-charge transistor 32. At the same time, the logic circuit 30 is prevented from discharging the internal output node 50 by removing the path to ground 58 through the evaluation transistor 36. In addition, because the domino gate 10 is in the active mode, the signal on line 24 is low, causing the standby transistor 40 to be turned off which removes the path from the internal output node 50 to ground 58 through the standby transistor 40. The high value from the internal output node 50 is inverted by the inverter 42 to generate a low output on the output line 28 which causes the feedback transistor 46 to be turned on. Thus, a second path is provided from the internal output node 50 to the power supply 54 through the feedback transistor 46.

When the signal received from the clock 18 on the clock signal input lines 14 goes high, the pre-charge transistor 32 is turned off and the evaluation transistor 36 is turned on. In this situation, the data received by the logic circuit 30 on the data input lines 20 is evaluated by the logic circuit 30 in order to provide an appropriate data value at the internal output node 50. This value is inverted by the inverter 42 to generate an output signal on the output line 28. For example, the data on the data input lines 20 may provide a path from the internal output node 50 to the evaluation transistor 36. Because the evaluation transistor 36 is on, the internal output node 50 will provide a low data value. When this occurs, the inverter 42 generates a high output that turns off the feedback transistor 46 and isolates the internal output node 50 from the power supply 54.

Alternatively, the data on the data input lines 20 may block the path from the internal output node 50 to the evaluation transistor 36. In this situation, the internal output node 50 maintains the high value that was provided by the pre-charge transistor 32 when the clock was low. When this occurs, the inverter 42 generates a low output that turns on the feedback transistor 46, thereby providing a path from the internal output node 50 to the power supply 54 which reinforces the high data value at the internal output node 50.

Figure 2:
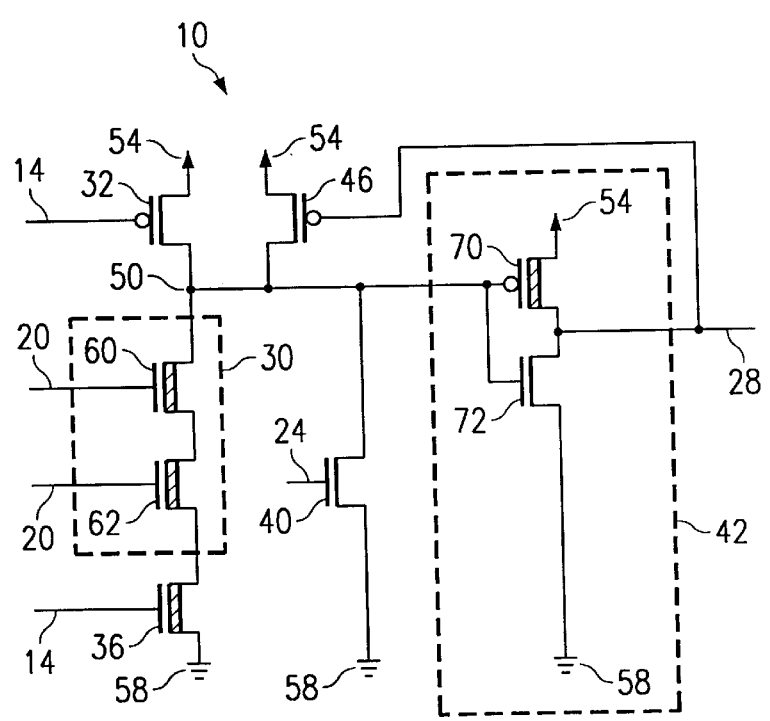
FIG. 2 is a schematic diagram illustrating the domino gate of FIG. 1 in accordance with one embodiment of the present invention.

FIG. 2 is a schematic diagram illustrating the domino gate 10 in accordance with one embodiment of the present invention. According to this embodiment, the domino gate 10 comprises a domino two-input AND gate 10 based on the logic circuit 30. It will be understood, however, that the domino gate 10 may comprise an OR gate, an EXOR gate, or any other suitable domino gate without departing from the scope of the present invention.

The logic circuit 30 for the domino gate 10 comprises two logic transistors 60 and 62 coupled in series. Additionally, the inverter 42 comprises two inverter transistors 70 and 72 coupled in series. According to this embodiment, the logic transistors 60 and 62, the evaluation transistor 36, and the inverter transistor 70 comprise low threshold voltage transistors. The pre-charge transistor 32, the standby transistor 40, the feedback transistor 46 and the inverter transistor 72 comprise standard threshold voltage transistors. Alternatively, the standby transistor 40 comprises a low threshold voltage transistor with only minor negative impact to circuit performance. For this alternative, the size of the feedback transistor 46 is increased to counter the increased leakage current through the standby transistor 40 after pre-charge and before evaluation. However, with a larger feedback transistor 46, discharging node 50 during evaluation requires a greater amount of time, slowing down circuit operation. In FIG. 2, the low threshold voltage transistors 60, 62, 36 and 70 are illustrated differently from the standard threshold voltage transistors 32, 40, 46 and 72 for easier identification.

It will be understood that the low threshold voltage transistors have threshold voltages that are low relative to the threshold voltages of the standard threshold voltage transistors. Additionally, the threshold voltages of the low threshold voltage transistors are high relative to the ground 58, and the threshold voltages of the standard threshold voltage transistors are low relative to the power supply 54. For an exemplary embodiment, the power supply 54 provides about 1.2–1.5 volts, the threshold voltages of the standard threshold voltage transistors are about 0.5 volts, the threshold voltages of the low threshold voltage transistors are about 0.2–0.4 volts, and the ground 58 provides a reference voltage of about 0 volts.

Additionally, for this embodiment, the logic transistors 60 and 62, the evaluation transistor 36, the standby transistor 40, and the inverter transistor 72 are NMOS transistors. The pre-charge transistor 32, the inverter transistor 70, and the feedback transistor 46 are PMOS transistors.

Therefore, while in the active mode, when the clock signal provided by the clock 18 is low, the pre-charge transistor 32 is turned on and the internal output node 50 is precharged to a high value. When the clock signal provided by the clock 18 goes high, the internal output node 50 provides a data value based on the logic transistors 60 and 62. If the inputs received on lines 20 are both high, the logic transistors 60 and 62 are turned on. Also, because the clock signal is high, the evaluation transistor 36 is turned on. In this situation, the internal output node 50 has a path to ground 58, as previously described in connection with FIG. 1, and thus provides a low data value. However, if either of the inputs received on lines 20 is low, at least one of the logic transistors 60 or 62 is turned off, blocking the path from the internal output node 50 to ground 58. In this situation, the internal output node 50 maintains the pre-charged, high data value, as previously described in connection with FIG. 1.

For the situation in which the internal output node 50 has a path to ground 58, the internal output node 50 is discharged through transistors 60, 62 and 36. Thus, the discharge speed is based on low threshold voltage transistors 60, 62 and 36. In addition, the output provided on line 28 from the inverter 42 is coupled through a low threshold voltage transistor 70 to the power supply when the internal output node 50 is discharged. In this situation, the low value at the internal output node 50 is also isolated from the power supply 54 by standard threshold voltage transistors 32 and 46, thereby minimizing leakage current from the internal output node 50 to the power supply 54. Additionally, the output from the inverter 42 is isolated from the ground 58 by a standard threshold voltage transistor 72 in order to minimize leakage current from the output of the inverter 42 to the ground 58.

During the standby mode, because the clock signal provided by the clock 18 is high, the pre-charge transistor 32 is turned off and the standby transistor 40 is turned on. Thus, the internal output node 50 is discharged to a low value through the standby transistor 40. In this situation, the low value at the internal output node 50 is isolated from the power supply 54 by standard threshold voltage transistors 32 and 46, thereby minimizing leakage current from the internal output node 50 to the power supply 54. Additionally, the output from the inverter 42 is isolated from the ground 58 by a standard threshold voltage transistor 72 in order to minimize leakage current from the output of the inverter 42 to the ground 58.

Figure 3:
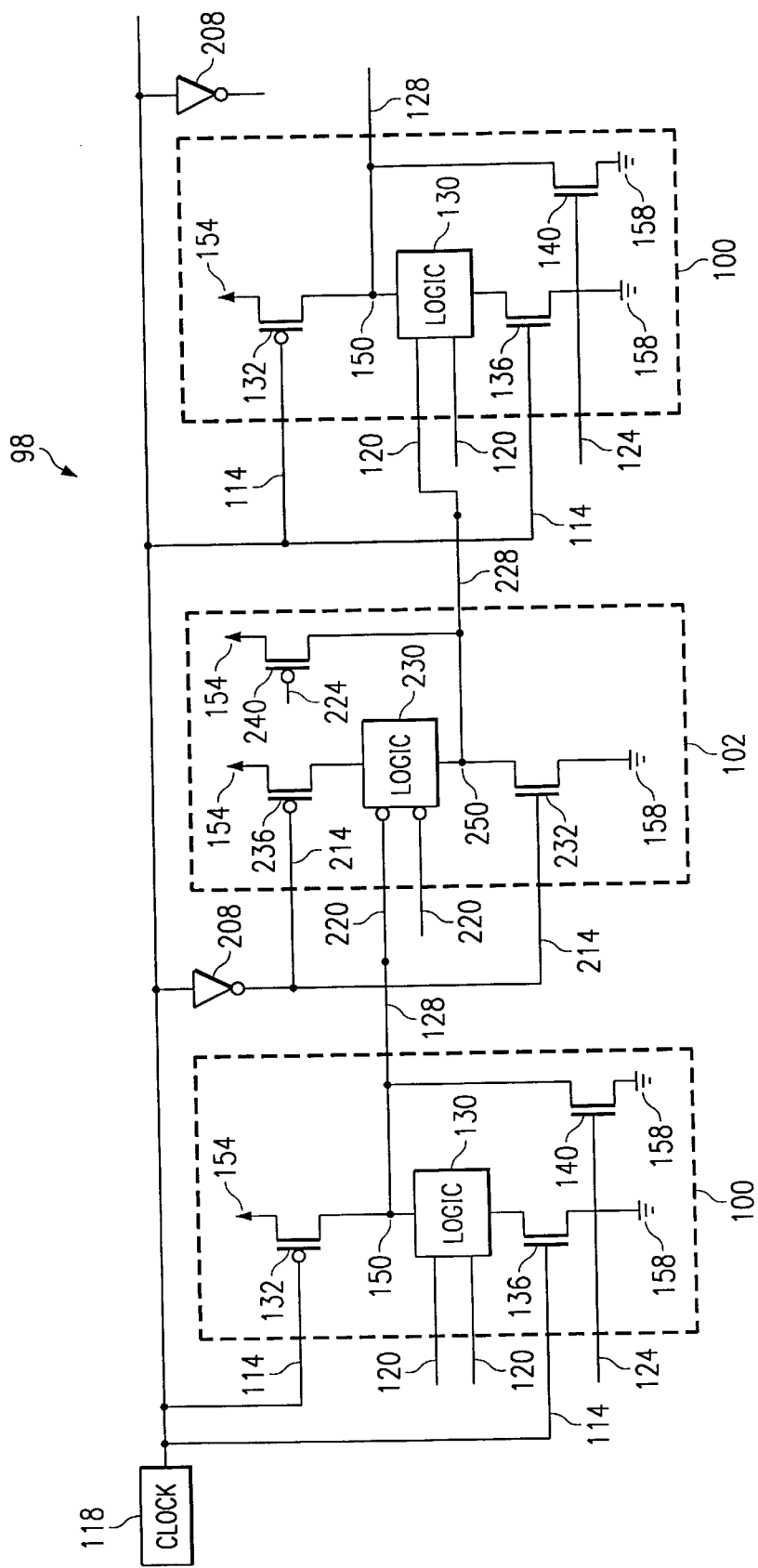
FIG. 3 is a block diagram illustrating a reduced-leakage current dynamic circuit constructed in accordance with another embodiment of the present invention.

FIG. 3 is a block diagram illustrating a reduced-leakage current dynamic circuit 98 constructed in accordance with another embodiment of the present invention. The dynamic circuit 98 may be a circuit for performing a complex logic function or any other suitable high speed dynamic circuit. The dynamic circuit 98 comprises a plurality of zipper gates 100 and a plurality of inverse zipper gates 102 constructed in accordance with one embodiment of the present invention. The zipper gates 100 comprise clock signal input lines 114 for receiving a clock signal from a clock 118, data input lines 120 for receiving data, a standby signal input line 124 for receiving a standby signal, and an output line 128 for producing an output signal. The zipper gates 100 also comprise a logic circuit 130, a pre-charge transistor 132, an evaluation transistor 136, and a standby transistor 140.

The inverse zipper gates 102 comprise clock signal input lines 214 for receiving a clock signal from a clock inverter 208, which receives a signal from the clock 118. The inverse zipper gates 102 also comprise data input lines 220 for receiving data, a standby signal input line 224 for receiving a standby signal, and an output line 228 for producing an output signal. The inverse zipper gates 102 also comprise a logic circuit 230, a precharge transistor 232, an evaluation transistor 236, and a standby transistor 240.

Although the embodiment shown in FIG. 3 includes two data input lines 120 and 220 for each zipper gate 100 and inverse zipper gate 102, it will be understood that the gates 100 and 102 may comprise any suitable number of data input lines 120 and 220 without departing from the scope of the present invention. In accordance with the embodiment shown, each gate 100 and 102 produces an output signal on an output line 128 or 228 that is received on a data input line 120 or 220 for a subsequent gate 100 or 102. Thus, the zipper gates 100 and the inverse zipper gates 102 are coupled together in an alternating fashion.

For the zipper gate 100, the logic circuit 130, the precharge transistor 132, and the standby transistor 140 are all coupled to an internal output node 150. In addition, the pre-charge transistor 132 is coupled to a power supply 154, and the evaluation transistor 136 and the standby transistor 140 are both coupled to ground 158. It will be understood that the ground 158 provides a voltage that is lower than the voltage provided by the power supply 154. Thus, the ground 158 may comprise a power supply or other suitable voltage reference without departing from the scope of the present invention.

For the inverse zipper gate 102, the logic circuit 230, the pre-charge transistor 232, and the standby transistor 240 are all coupled to an internal output node 250. In addition, the pre-charge transistor 232 is coupled to ground 158, and the evaluation transistor 236 and the standby transistor 240 are both coupled to the power supply 154.

In operation, the gates 100 and 102 may be in an active mode or a standby mode. In the active mode, the clock 118 provides an alternating clock signal on the clock signal input lines 114 and, through the clock inverters 208, on the clock signal input lines 214. In the standby mode, the clock 118 provides a steady signal on the clock signal input lines 114 and 214. In accordance with an exemplary embodiment, the clock 118 provides a steady high signal on the clock signal input lines 114 and a steady low signal on the clock signal input lines 214 while in the standby mode. Also, while in the standby mode, a standby signal is received by the standby transistors 140 and 240 on the standby input lines 124 and 224, respectively. According to the exemplary embodiment, the standby signal received on the standby input lines 124 is high and on lines 224 is low. Thus, while in the active mode, the signal provided on the standby input lines 124 is low and on lines 224 is high.

For the zipper gates 100, the logic circuit 130 comprises logic transistors having low threshold voltages, and the evaluation transistor 136 is a low threshold voltage transistor. The pre-charge transistor 132 and the standby transistor 140 are standard threshold voltage transistors. As previously described in connection with FIG. 2, however, the standby transistor 140 may be a low threshold voltage transistor. Thus, the zipper gates 100 operate similarly to the domino gates 10, without including an inverter or a feedback transistor. Instead, the output produced on the output line 128 has the same value as the internal output node 150.

For the inverse zipper gates 102, the logic circuit 230 comprises logic transistors having low threshold voltages, and the evaluation transistor 236 is a low threshold voltage transistor. The pre-charge transistor 232 and the standby transistor 240 are standard threshold voltage transistors, although, as with the case of the standby transistor 140, the standby transistor 240 may be a low threshold voltage transistor. Thus, the inverse zipper gates 102 operate similarly to the zipper gates 100. However, instead of the internal output node 250 being pre-charged to a high value and discharged to a low value, the internal output node 250 is "pre-charged" to a low value and "discharged" to a high value.

It is not always necessary to have a standby transistor in every domino gate, or sub-circuit. If it can be guaranteed that all the input lines to a sub-circuit are high during standby, then a standby transistor is not needed in that sub-circuit. This is illustrated in FIGS. 4 and 5.

Figure 4:
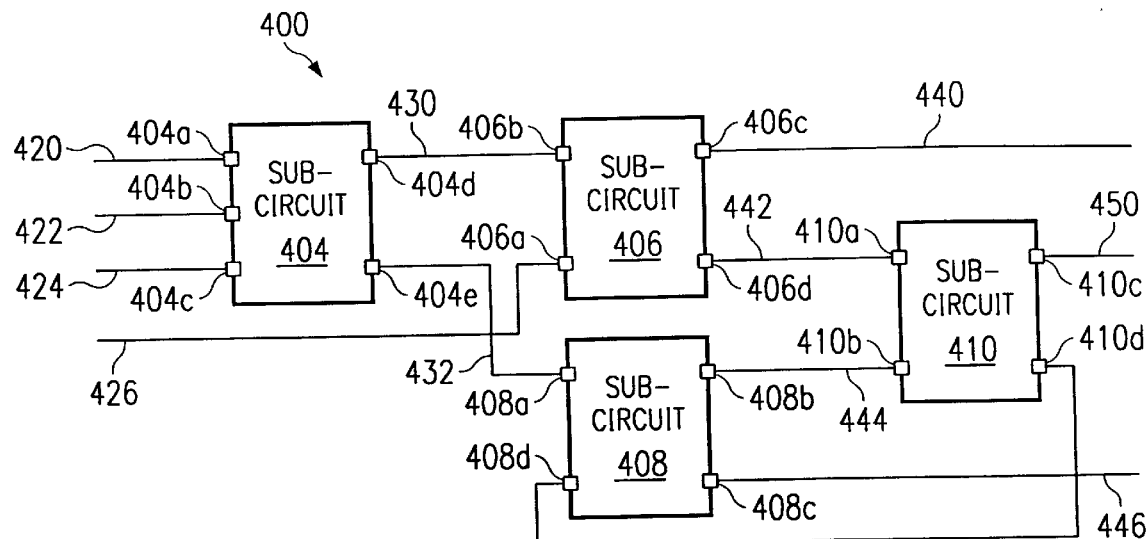
FIG. 4 is a block diagram illustrating a reduced-leakage current dynamic circuit including sub-circuits, such as the domino gate of FIG. 1 or the zipper gate of FIG. 3, constructed in accordance with one embodiment of the present invention.
Figure 5:
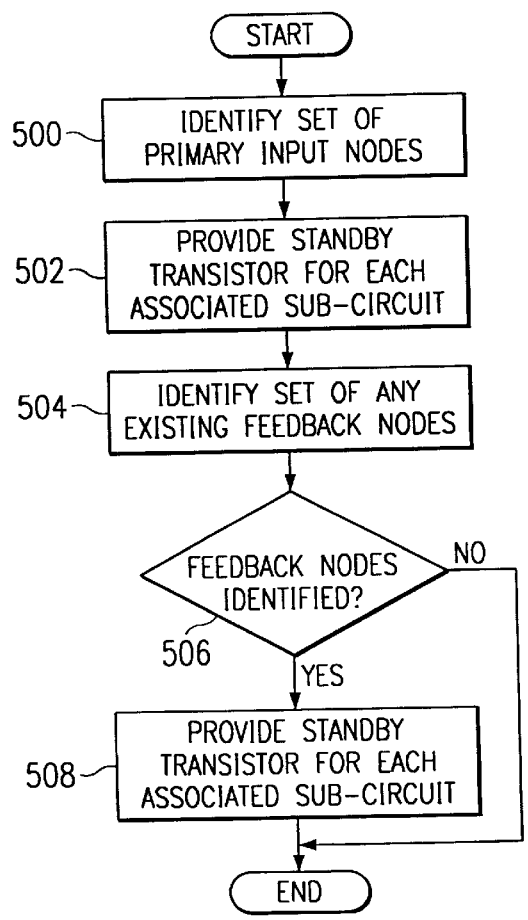
FIG. 5 is a flow diagram illustrating a method for designing an optimized reduced-leakage current dynamic circuit such as the dynamic circuit illustrated in FIG. 4.

FIG. 4 is a block diagram illustrating a reduced-leakage current dynamic circuit 400 including a plurality of sub-circuits 404, 406, 408 and 410 constructed in accordance with one embodiment of the present invention. The sub-circuits 404, 406, 408 and 410 may comprise domino gates 10, zipper gates 100, inverse zipper gates 102, or any other suitable sub-circuit constructed with low threshold voltage transistors in accordance with the present invention.

In accordance with an exemplary embodiment, sub-circuit 404 receives three inputs on lines 420, 422 and 424 at nodes 404a, 404b and 404c, respectively, and sub-circuit 406 receives an input on line 426 at node 406a. Sub-circuit 404 generates an output at node 404d that is provided on line 430 as an input to sub-circuit 406 at node 406b and an output at node 404e that is provided on line 432 as an input to sub-circuit 408 at node 408a.

Sub-circuit 406 generates two outputs on lines 440 and 442 at nodes 406c and 406d, respectively. The output on line 440 is provided as an output for the circuit 400, while the output on line 442 is provided as an input to sub-circuit 410 at node 410a.

Sub-circuit 408 generates two outputs on lines 444 and 446 at nodes 408b and 408c, respectively. The output on line 444 is provided as an input to sub-circuit 410 at node 410b, while the output on line 446 is provided as an output for the circuit 400.

Sub-circuit 410 generates two outputs on lines 450 and 452 at nodes 410c and 410d, respectively. The output on line 450 is provided as an output for the circuit 400, while the output on line 452 is provided as an input for the sub-circuit 408 at node 408d.

It will be understood that the number of inputs received and outputs generated by the sub-circuits, as well as the number and placement of the sub-circuits, maybe adjusted in accordance with the circuit requirements for any given application without departing from the scope of the present invention.

FIG. 5 is a flow diagram illustrating a method for designing an optimized reduced-leakage current dynamic circuit 400. The circuit 400 comprises a plurality of sub-circuits 404, 406, 408 and 410. The circuit 400 is optimized by minimizing the use of standby transistors 40, 140 and 240 which increase the area requirements for the circuit 400.

The method begins at step 500 where a set of primary input nodes for the circuit 400 is identified. Referring to FIG. 4 as an exemplary embodiment of the circuit 400, these primary input nodes include nodes 404a, 404b, 404c and 406a. At step 502, a standby transistor 40, 140 or 240 is provided for each sub-circuit associated with a primary input node. For the exemplary embodiment, these sub-circuits include sub-circuit 404 and sub-circuit 406.

At step 504, a set of any existing feedback nodes for the circuit 400 is identified. A feedback node includes an input node for a specified sub-circuit that receives data that is affected by the specified sub-circuit. Thus, a feedback-providing sub-circuit provides a signal to a feedback node associated with a feedback-receiving sub-circuit. This signal is affected by the feedback-receiving sub-circuit. For the exemplary embodiment, node 408d is a feedback node because node 408d is an input node for sub-circuit 408 and receives data from sub-circuit 410 which receives data from sub-circuit 408. Thus, the data provided to sub-circuit 408 on line 452 at node 408d is affected by sub-circuit 408 by way of line 444 and sub-circuit 410.

At decisional step 506, a determination is made as to whether any feedback nodes were identified. If no feedback nodes were identified, the method follows the No branch from decisional step 506, and the method comes to an end. However, if any feedback nodes were identified, the method follows the Yes branch from decisional step 506 to step 508. At step 508, a standby transistor 40, 140 or 240 is provided for each sub-circuit associated with a feedback node. For the exemplary embodiment, these sub-circuits include sub-circuit 408.

Therefore, for each set of sub-circuits that comprise a feedback loop, only one of the sub-circuits is provided with a standby transistor, unless any of the other sub-circuits in the loop are associated with a primary input node. Thus, for the exemplary embodiment, a standby transistor 40, 140 or 240 does not need to be provided for sub-circuit 410. It will be understood that, for complex circuits 400, the number of sub-circuits which are provided with a standby transistor 40, 140 or 240 may be a relatively small percentage of the total number of sub-circuits. Thus, the disclosed method may substantially reduce the area requirements for the circuit 400.

Although the present invention has been described with several embodiments, various changes and modifications may be suggested to one skilled in the art. It is intended that the present invention encompass such changes and modifications as fall within the scope of the appended claims.

What is claimed is:

1. A reduced-leakage current dynamic circuit having an active mode and a standby mode and including transistors having a standard threshold voltage and transistors having a low threshold voltage lower than the standard threshold voltage, comprising:

a logic circuit coupled between an internal output node and ground, the logic circuit comprising a plurality of logic transistors each having the low threshold voltage, the logic circuit conditionally coupling the internal output node to the reference dependent upon logic signals received by the plurality of logic transistors;

a pre-charge transistor coupled to the internal output node and a pre-charge voltage, the pre-charge transistor having the standard threshold voltage, the pre-charge transistor receiving a clock signal, the clock signal in the active mode alternating between a first voltage causing the pre-charge transistor to couple the internal node of the pre-charge voltage and a second voltage causing the pre-charge transistor to isolate the internal node from the pre-charge voltage, the clock signal in the standby mode maintaining the second voltage isolating the internal node from the pre-charge voltage; and a standby transistor coupled between the internal output node and ground the standby transistor the standby transistor receiving a standby signal, the standby signal in the active move causing the standby transistor to isolate the internal output node from ground, the standby signal in the active mode causing the standby transistor to couple the internal output node to ground.

2. The circuit of claim 1, further comprising an evaluation transistor coupled between the logic circuit and ground, the evaluation transistor having the low threshold voltage.

3. The circuit of claim 1, further comprising an inverter having an input coupled to the internal output node and an output forming the output of the circuit, the inverter comprising a first inverter transistor having the standard threshold voltage, the first inverter transistor having a source-drain path connected between the output and ground, and a gate connected to the internal output node, and the second inverter transistor having a low threshold voltage, the second inverter transistor having a source-drain path connected between a power supply voltage and the output, and a gate connected to the internal output node.

4. The circuit of claim 3, further comprising:
the logic circuit comprising at least two NMOS logic transistors;
the pre-charge transistor comprising a PMOS transistor coupled to a between the power supply and the internal output node;
the standby transistor comprising an NMOS transistor coupled between the internal output node and ground;
the first inverter transistor comprising an NMOS transistor coupled between the output and ground; and
the second inverter transistor comprising a PMOS transistor coupled between the power supply and the output.

5. A method for designing an optimized reduced-leakage current dynamic circuit, the dynamic circuit comprising a plurality of sub-circuits, each sub-circuit having an active mode and a standby mode, each sub-circuit having an internal output node, a pre-charge transistor having a standard threshold voltage, a source-drain path connected between a power voltage source and the internal output node and a gate receiving a clock signal and a conditional discharge logic circuit connected between the internal output node and ground including at least one transistor having a low threshold voltage lower than the standard threshold voltage, the conditional logic circuit receiving at least one input and conditionally providing a discharge path between the internal output node and ground dependent on a logic state of the at least one input, the clock signal in the active mode cycling between a voltage causing the pre-charge transistor to conduct and a second voltage causing the pre-charge transistor to be cut off, the clock signal in the standby mode maintaining the second voltage cutting off the pre-charge transistor, the method comprising:
identifying a set of primary input nodes for receiving inputs for the circuit, each primary input node associated with a sub-circuit;
providing a standby transistor for each sub-circuit associated with a primary input node, the standby transistor having a source-drain path coupled between the internal output node of the sub-circuit and ground, the standby transistor having a gate receiving a standby signal, the standby signal in the active mode causing the standby transistor to be cut off and in the standby mode causing the standby transistor to conduct.

6. The method of claim 5, further comprising:
identifying a set of feedback nodes for receiving signals from feedback-providing sub-circuits, each feedback node associated with a feedback-receiving sub-circuit for a feedback loop;
providing a standby transistor for at least one feedback-receiving sub-circuit for each feedback loop, the standby transistor coupled between the internal output node of the feedback-receiving sub-circuit and, the standby transistor having a gate receiving the standby signal.

7. A method for reducing leakage current in a dynamic logic circuit having an active mode and a standby mode, the dynamic logic circuit having at least one transistor with a standard threshold voltage and at least one transistor with a low threshold voltage lower than the standard threshold voltage, the method comprising the steps of:
in the active mode
charging an internal output node to a pre-charge voltage via a pre-charge transistor having the standard threshold voltage;
conditionally discharging the internal output node to ground via a logic block corresponding to a logic state of at least one input, the logic block including at least one logic transistor, each logic transistor having the low threshold voltage;
in the standby mode
cutting off the pre-charge transistor preventing charging the internal node to the pre-charge voltage; and
discharging the internal output node to ground via a standby transistor having the standard threshold voltage.

8. The method of claim 7, wherein:
said steps of charging the internal output node and conditionally discharging the internal output node in the active mode include periodically and repetitively supplying a clock signal to the pre-charge transistor, the clock signal cycling between a first voltage causing the pre-charge transistor to conduct and a second voltage cutting the pre-charge transistor off.

9. The method of claim 8, wherein:
said step of cutting off the pre-charge transistor and discharging the internal output node to ground in the standby mode includes
supplying the clock signal at the second voltage to the pre-charge transistor in the standby mode, and
supplying a standby signal to the standby transistor, the standby signal having a third voltage cutting off the standby transistor in the active mode and having a fourth voltage causing the standby transistor to conduct in the standby mode.

* * * * *